(12) United States Patent
Ding et al.

(10) Patent No.: US 10,025,433 B2
(45) Date of Patent: Jul. 17, 2018

(54) TOUCH DISPLAY DEVICE AND METHOD FOR MANUFACTURING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Xiaoliang Ding, Beijing (CN); Xue Dong, Beijing (CN); Haisheng Wang, Beijing (CN); Shengji Yang, Beijing (CN); Tao Ren, Beijing (CN)

(73) Assignees: BOE TECHNOLOGY GROUP CO., LTD. (CN); BEIJING BOE OPTOELECTRONICS TECHNOLOGY CO., LTD. (CN)

(*) Notice: Subject to any disclaimer, the term of this patent is extended or adjusted under 35 U.S.C. 154(b) by 182 days.

(21) Appl. No.: 14/424,476

(22) PCT Filed: Aug. 19, 2014

(86) PCT No.: PCT/CN2014/084734
§ 371 (c)(1),
(2) Date: Feb. 27, 2015

(87) PCT Pub. No.: WO2015/106566
PCT Pub. Date: Jul. 23, 2015

(65) Prior Publication Data
US 2016/0034064 A1    Feb. 4, 2016

(30) Foreign Application Priority Data

Jan. 20, 2014  (CN) .......................... 2014 1 0024673

(51) Int. Cl.
*G06F 3/045* (2006.01)
*G06F 3/044* (2006.01)
(Continued)

(52) U.S. Cl.
CPC ............ *G06F 3/044* (2013.01); *G06F 3/0412* (2013.01); *G06F 3/0416* (2013.01); *G09G 3/36* (2013.01);
(Continued)

(58) Field of Classification Search
CPC ...... G06F 3/044; G06F 3/0412; G06F 3/0416; G06F 2203/04104; G06F 2203/04112; G09G 3/36; H05K 3/10
(Continued)

(56) References Cited

U.S. PATENT DOCUMENTS

2009/0009485 A1*  1/2009  Bytheway .............. G06F 3/044
                                                        345/174
2010/0220075 A1   9/2010  Kuo et al.
(Continued)

FOREIGN PATENT DOCUMENTS

CN     101488066 A     7/2009
CN     101739187 A     6/2010
(Continued)

OTHER PUBLICATIONS

International Search Report and Written Opinion in PCT International Application No. PCT/CN2014/084734, dated Nov. 21, 2014.
(Continued)

*Primary Examiner* — Mark Regn
(74) *Attorney, Agent, or Firm* — Brooks Kushman P.C.

(57) ABSTRACT

The present disclosure provides a touch display device and a method for manufacturing the same. The touch display device includes a first substrate and a second substrate. The first substrate is provided with a common electrode and a driving electrode. The second substrate is provided with a detection electrode and a driving electrode. The detection electrode is opposite to the common electrode. A coverage area of the detection electrode is smaller than a coverage
(Continued)

area of the common electrode, the coverage area of the detection electrode on the second substrate does not overlap with a coverage area of the driving electrode on the first substrate when the first substrate and the second substrate are assembled to form a cell. The suspension electrode is arranged on at least one side of the detection electrode and insulated from the detection electrode.

20 Claims, 10 Drawing Sheets

(51) Int. Cl.
    *G06F 3/041*     (2006.01)
    *G09G 3/36*     (2006.01)
    *H05K 3/10*     (2006.01)

(52) U.S. Cl.
    CPC ..... *H05K 3/10* (2013.01); *G06F 2203/04103* (2013.01); *G06F 2203/04104* (2013.01); *G06F 2203/04112* (2013.01)

(58) Field of Classification Search
    USPC .......................................................... 345/174
    See application file for complete search history.

(56) References Cited

U.S. PATENT DOCUMENTS

| | | | | |
|---|---|---|---|---|
| 2011/0007011 A1* | 1/2011 | Mozdzyn | ................ | G06F 3/044 345/173 |
| 2011/0221700 A1* | 9/2011 | Mo | ......................... | G06F 3/044 345/174 |
| 2012/0113027 A1 | 5/2012 | Song et al. | | |
| 2014/0285466 A1* | 9/2014 | Hayashi | .................. | G06F 3/044 345/174 |

FOREIGN PATENT DOCUMENTS

| | | | |
|---|---|---|---|
| CN | 101882040 | A | 11/2010 |
| CN | 102339188 | A | 2/2012 |
| CN | 202189346 | U | 4/2012 |
| CN | 102955636 | A | 3/2013 |
| CN | 103049155 | A | 4/2013 |
| CN | 103049157 | * | 4/2013 |
| CN | 103049157 | A | 4/2013 |
| CN | 202948433 | U | 5/2013 |
| CN | 103218097 | A | 7/2013 |
| CN | 203178998 | U | 9/2013 |
| CN | 203299763 | U | 11/2013 |
| CN | 203350823 | U | 12/2013 |
| CN | 103777815 | A | 5/2014 |
| CN | 203658987 | U | 6/2014 |
| KR | 10 2011 0124472 | A | 11/2011 |
| WO | 2013/141056 | A1 | 9/2013 |
| WO | 2013/175726 | A1 | 11/2013 |

OTHER PUBLICATIONS

Office Action in Chinese Patent Application No. 201410024673.0, dated Mar. 2, 2017.

Fourth Office Action for Chinese Application No. 201410024673.0, dated Sep. 5, 2017, 9 Pages.

* cited by examiner

TOUCH DISPLAY DEVICE AND METHOD FOR MANUFACTURING THE SAME

CROSS-REFERENCE TO RELATED APPLICATION

The present application is the U.S. national phase of PCT Application No. PCT/CN2014/084734 filed on Aug. 19, 2014, which claims a priority of the Chinese patent application No. 201410024673.0 filed on Jan. 20, 2014, which is incorporated herein by reference in its entirety.

TECHNICAL FIELD

The present disclosure relates to the field of display technologies, and more particularly to a touch display device and a method for manufacturing the same.

BACKGROUND

A touch screen, as an input media, may provide better convenience for users compared with a keyboard or a mouse. According to different implementation principles, the touch screen can be divided into resistive, capacitive, surface acoustic wave, infrared touch screen, etc. Currently, the resistive and capacitive touch screen technologies are widely used.

The capacitive touch screen is more and more popular by virtue of its higher sensitivity and true multi-touch advantages. The basic principle of the capacitive touch screen is: applying voltage in a driving line side and detecting signal changes in a detection line side. The driving line determines an X coordinate, and the detection line determines a Y coordinate. During detection, the driving lines in the X direction are progressively scanned; when scanning each row of driving lines, signal in each detection line is read. After a round of scanning, each intersection point of rows and columns can be scanned and X*Y signals are scanned. The detection method can specifically determine coordinates of multi points, and thus multi-touch can be realized. An equivalent circuit is specifically shown in FIG. 1 and includes a signal source 101, a driving line resistor 103, a mutual capacitor 102 between the driving line and the detection line, a parasitic capacitor 105 between the detection line and a common electrode layer, a detection line resistor 106, and a detection circuit 107. When a finger touches the touch screen, one part of current flows into the finger, and this is equivalent to changing of mutual capacitance between the driving line and an induction line, which causes weak current change to be detected in a detection side.

Currently, the widely used capacitive touch screen may include an add-on capacitive touch screen and an in-cell capacitive touch screen.

The add-on capacitive touch screen is separately manufactured from a liquid crystal display (LCD) and then attached to the LCD. However, currently, the add-on capacitive touch screen is gradually replaced by the in-cell capacitive touch screen due to cost, light transmittance, thickness of module and other reasons.

SUMMARY

The present disclosure provides a touch display device and a method for manufacturing the same, which can reduce parasitic capacitance between the detection electrode and the common electrode, thereby ensuring quality of touch sensing signal acquired by a chip and improving touch induction capacitance change rate.

One embodiment of the present disclosure provides a touch display device including a first substrate and a second substrate; wherein a common electrode layer of the first substrate is provided with a common electrode and a driving electrode which are alternately arranged;

the second substrate is provided with a detection electrode; the detection electrode is arranged opposite to the common electrode; a coverage area of the detection electrode on the second substrate is smaller than a coverage area of the common electrode on the first substrate, the coverage area of the detection electrode on the second substrate does not overlap with a coverage area of the driving electrode on the first substrate when the first substrate and the second substrate are assembled to form a cell; and the second substrate is further provided with a suspension electrode, and the suspension electrode is arranged on at least one side of the detection electrode and insulated from the detection electrode.

Optionally, a width of the detection electrode is smaller than that of the common electrode, and a length of the detection electrode is equal to that of the common electrode.

Optionally, a width of the detection electrode is smaller than that of the common electrode, and a length of the detection electrode is smaller than that of the common electrode.

Optionally, a width of the detection electrode is equal to that of the common electrode, and a length of the detection electrode is smaller than that of the common electrode.

Optionally, a sum of the width of the detection electrode and a width of the suspension electrode arranged on at least one side of the detection electrode along the horizontal direction is equal to or greater than the width of the common electrode corresponding to the detection electrode.

Optionally, a sum of the length of the detection electrode and a length of the suspension electrode arranged on at least one side of the detection electrode along the vertical direction is equal to the length of the common electrode corresponding to the detection electrode.

Optionally, the detection electrode is formed by at least two segments of metal wires; different segments of metal wires are electrically connected.

Optionally, the suspension electrode and the detection electrode are arranged in a same layer.

Optionally, a layer where the suspension electrode is arranged is below or above a layer where the detection electrode is arranged.

Optionally, a flat layer is arranged between the suspension electrode and the detection electrode.

Optionally, the second substrate is further provided with a black matrix for covering the detection electrode and the suspension electrode, and the black matrix is arranged on the detection electrode and the suspension electrode.

Optionally, the first substrate is an array substrate, and the second substrate is a color filter substrate.

Optionally, different common electrodes separated by driving electrodes are transversely connected by metal wires of a gate electrode layer.

Optionally, different driving electrodes separated by common electrodes are transversely connected by metal wires of a gate electrode layer.

One embodiment of the present disclosure further provides a method for manufacturing a touch display device including steps of:

providing a first substrate and a second substrate;

forming a common electrode layer on the first substrate, the common electrode layer including a pattern of a common electrode and a driving electrode which are alternately arranged; and forming patterns of a detection electrode and a suspension electrode on the second substrate in such a manner that the detection electrode is arranged opposite to the common electrode, a coverage area of the detection electrode on the second substrate is smaller than a coverage area of the common electrode on the first substrate, the coverage area of the detection electrode on the second substrate does not overlap with a coverage area of the driving electrode on the first substrate when the first substrate and the second substrate are assembled to form a cell;

wherein the suspension electrode is arranged on at least one side of the detection electrode and insulated from the detection electrode.

Optionally, the step of forming a pattern of the detection electrode on the second substrate includes:

forming at least two segments of metal wires at preset positions in a preset layer of the second substrate; and electrically connecting the at least two segments of metal wires so that the at least two segments of metal wires being electrically connected form the pattern of the detection electrode.

Optionally, the patterns of the detection electrode and the suspension electrode are formed in the same layer through a one-time patterning process.

Optionally, the step of forming the patterns of the detection electrode and the suspension electrode on the second substrate includes:

forming a pattern of the detection electrode on the second substrate;

forming a pattern of a flat layer on the detection electrode; and forming a pattern of the suspension electrode on the flat layer; or the step of forming the patterns of the detection electrode and the suspension electrode on the second substrate includes:

forming a pattern of the suspension electrode on the second substrate;

forming a pattern of a flat layer on the suspension electrode; and forming a pattern of the detection electrode on the flat layer.

Optionally, the method further includes;

forming a pattern of a black matrix on the detection electrode and the suspension electrode of the second substrate so as to cover the detection electrode and the suspension electrode.

It can be seen from the above description that, in the touch display device and the method for manufacturing the same in the present disclosure, the touch display device includes the first substrate and the second substrate, the first substrate is provided with the common electrode and the driving electrode, the second substrate is provided with the detection electrode and the suspension electrode, the detection electrode is opposite to the common electrode, a coverage area of the detection electrode is smaller than a coverage area of the common electrode, the coverage area of the detection electrode on the second substrate does not overlap with a coverage area of the driving electrode on the first substrate when the first substrate and the second substrate are assembled to form a cell; the suspension electrode is arranged on at least one side of the detection electrode and insulated from the detection electrode. Thus, the parasitic capacitance between the detection electrode and the common electrode may be reduced, thereby ensuring quality of touch sensing signal acquired by a chip and improving touch induction capacitance change rate.

DETAILED DESCRIPTION

In order to make objects, technical details and advantages of embodiments of the present disclosure apparent, hereinafter, the technical solutions of the embodiments of the present disclosure will be described in a clearly and fully understandable way in connection with the drawings related to the embodiments of the present disclosure. It is obvious that the described embodiments are just a part but not all of the embodiments of the present disclosure. Based on the described embodiments of the present disclosure, those ordinarily skilled in the art can obtain other embodiment(s), without any inventive work, which should be within the scope sought for protection by the present disclosure.

Unless otherwise defined, the technical or scientific terminology used herein should have the same meaning as commonly understood by one of ordinary skill in the art to which this invention belongs. Terms such as "first", "second" and the like used in specification and claims of the application of the invention do not show any order, number or importance, but are only used to distinguish different constituent parts. Likewise, a term "a," "an," or the like does not indicate limitation in number, but specifies the presence of at least one. A term such as "connect," "couple," or the like is not limited to physical or mechanical connection, but can include electrical connection, whether directly or indirectly. "Upper," "lower," "left," "right" or the like is only used to describe a relative positional relationship, and when the absolute position of a described object is changed, the relative positional relationship might also be changed accordingly.

Figure 1:
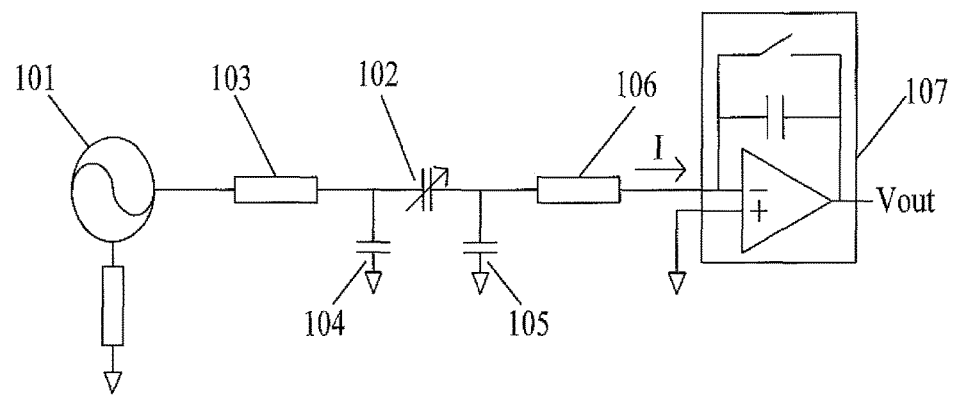
FIG. 1 is a schematic diagram of an equivalent circuit of a touch screen in the related art.
Figure 2:
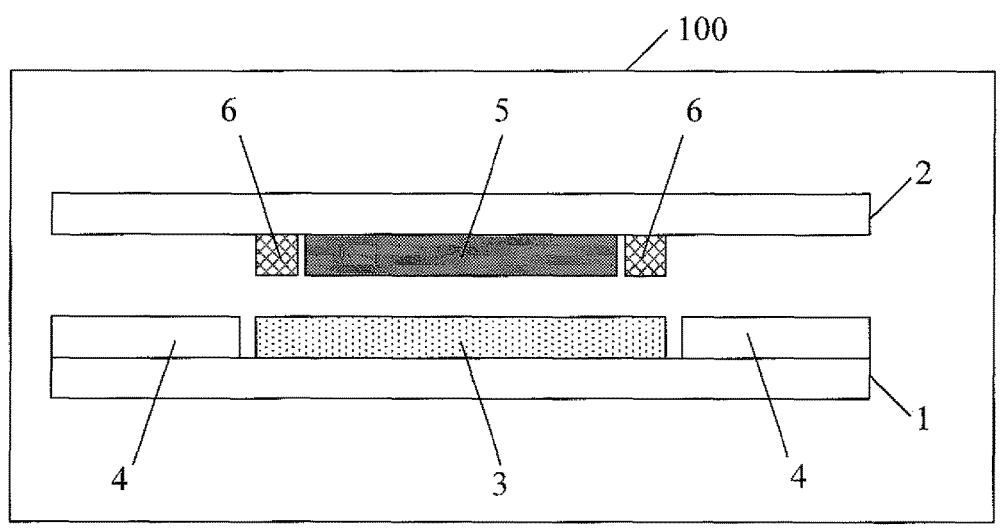
FIG. 2 is a first schematic diagram showing a structure of a touch display device in one embodiment of the present disclosure.

One embodiment of the present disclosure provides a touch display device 100. As shown in FIG. 2, the touch display device 100 may specifically include a first substrate 1 and a second substrate 2. A common electrode (Vcom) 3 and a driving electrode (TX) 4 are alternately arranged in a common electrode layer on the first substrate 1.

A detection electrode (RX) 5 is arranged on the second substrate 2. The detection electrode 5 is arranged opposite to the common electrode 3. A coverage area of the detection electrode 5 is smaller than a coverage area of the common electrode 3. The coverage area of the detection electrode 5 on the second substrate 2 does not overlap with a coverage area of the driving electrode 4 on the first substrate 1 when the first substrate 1 and the second substrate 2 are assembled to form a cell.

A suspension electrode 6 is further arranged on the second substrate 2. The suspension electrode 6 is arranged on at least one side of the detection electrode 5. The suspension electrode 6 is insulated from the detection electrode 5.

In the touch display device 100 in one embodiment of the present disclosure, parasitic capacitance between the detection electrode 5 and the common electrode 3 may be reduced by reducing the coverage area of the detection electrode, i.e., reducing overlapping (i.e., superposition) area between the detection electrode 5 and the common electrode 3, thereby ensuring quality of touch sensing signal acquired by a chip. Meanwhile, the presence of the suspension electrode 6 may improve touch induction capacitance change rate at the time of reducing the parasitic capacitance between the detection electrode 5 and the common electrode 3.

Figure 3:
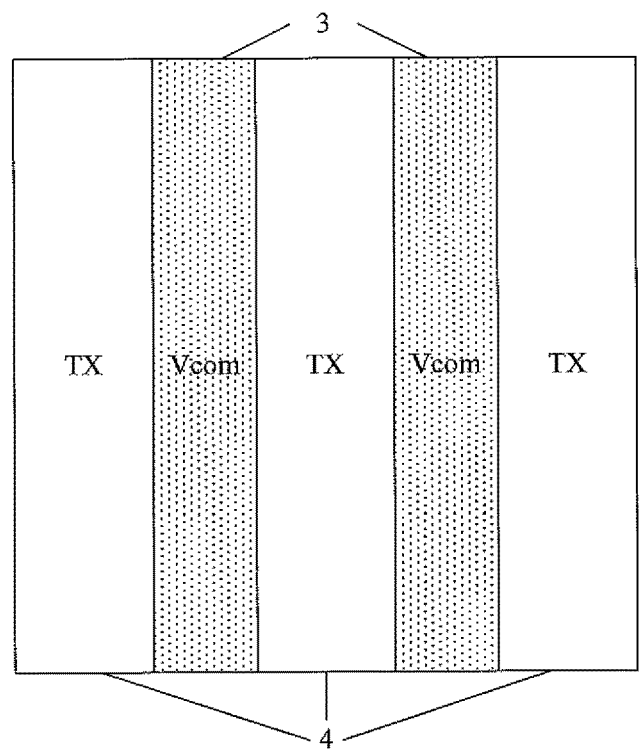
FIG. 3 is a schematic diagram showing a structure of a first substrate in one embodiment of the present disclosure.
Figure 19:
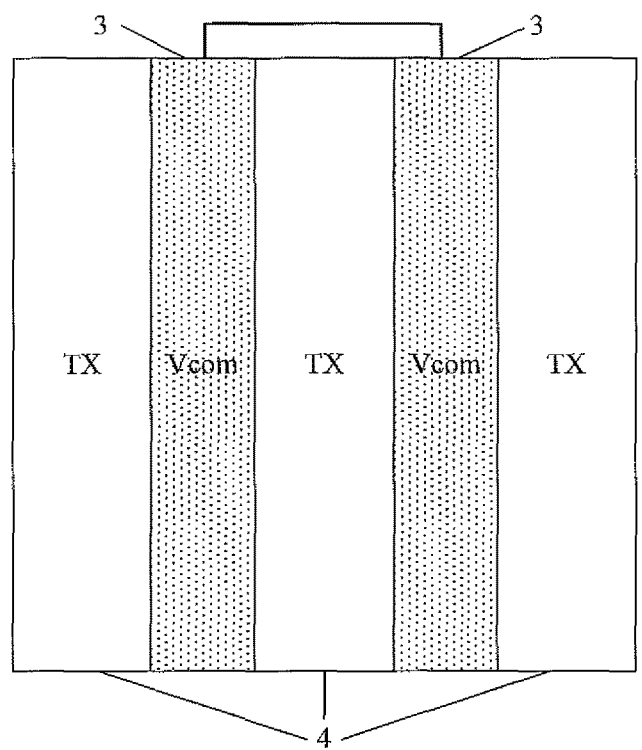
FIG. 19 is a schematic diagram showing a structure of a first substrate in one embodiment of the present disclosure.
Figure 20:
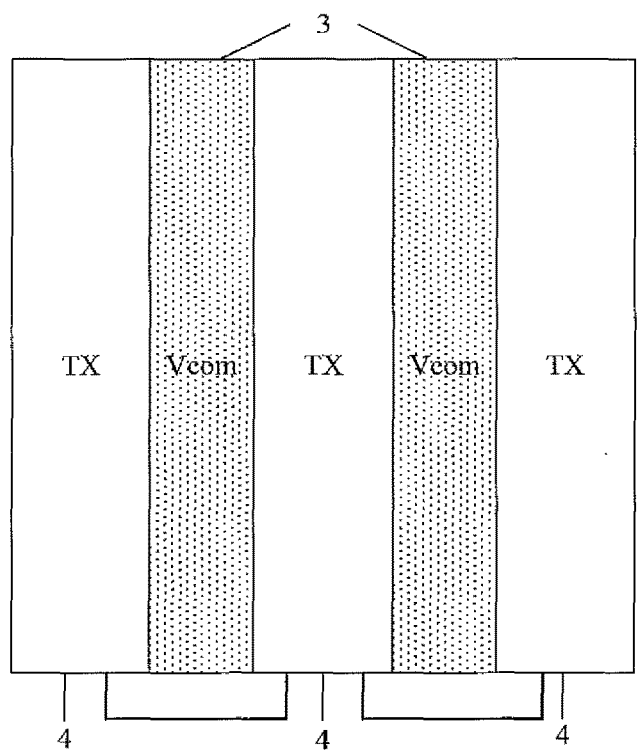
FIG. 20 is a schematic diagram showing a structure of a first substrate in one embodiment of the present disclosure.

The first substrate 1 involved in one embodiment of the present disclosure may specifically be shown in FIG. 3. The common electrode (Vcom) 3 and the driving electrode (TX) 4 which are alternately arranged may be formed by cutting material of the common electrode layer on the first substrate 1. Vertical bar regions represented by shadows in FIG. 3 are the common electrodes 3. The different common electrodes 3 separated by the driving electrodes 4 may be transversely connected by metal wires of a gate electrode layer, as shown in FIG. 19. Regions represented by rectangular boxes in FIG. 3 are the driving electrodes 4. The different driving electrodes 4 separated by the common electrodes 3 may be transversely connected by metal wires of the gate electrode layer, as shown in FIG. 20.

In one embodiment of the present disclosure, since the coverage area of the detection electrode 5 on the second substrate 2 does not overlap with the coverage area of the driving electrode 4 on the first substrate 1 when the first substrate 1 and the second substrate 2 are assembled to form a cell, thus, an area where the driving electrode 4 directly faces the detection electrode 5 is avoided, thereby diverging electric field to touch space of a touch object such as a finger to maximum extent.

Figure 4:
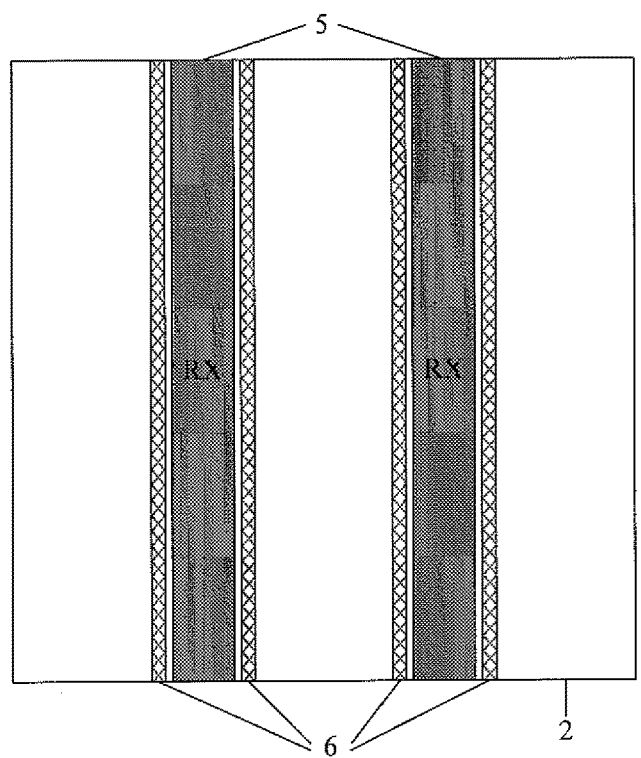
FIG. 4 is a first schematic diagram showing a structure of a second substrate in one embodiment of the present disclosure.

The second substrate 2 in one embodiment of the present disclosure may specifically be shown in FIG. 4. The second substrate 2 is specifically provided with the detection electrode 5 and the suspension electrode 6.

In this embodiment of the present disclosure, since the coverage area of the detection electrode 5 is smaller than the coverage area of corresponding common electrode 3, thus, the overlapping area between the detection electrode 5 and the common electrode 3 is reduced, thereby reducing the parasitic capacitance between the detection electrode 5 and the common electrode 3.

In this embodiment of the present disclosure, although the reduction of the coverage area of the detection electrode 5 may reduce capacitance between the detection electrode 5 and the touch object (such as a finger, a stylus, etc.), and reduce mutual capacitance between the detection electrode 5 and the driving electrode 4, the added suspension electrode 6 in this embodiment of the present disclosure may increase the mutual capacitance between the detection electrode 5 and the driving electrode 4 to some extent. Further, the capacitance between the detection electrode 5 and the touch object is not greatly reduced when the coverage area of the detection electrode 5 is reduced, instead, the capacitance existed between the suspension electrode 6 and the touch object may remedy this problem.

Figure 5:
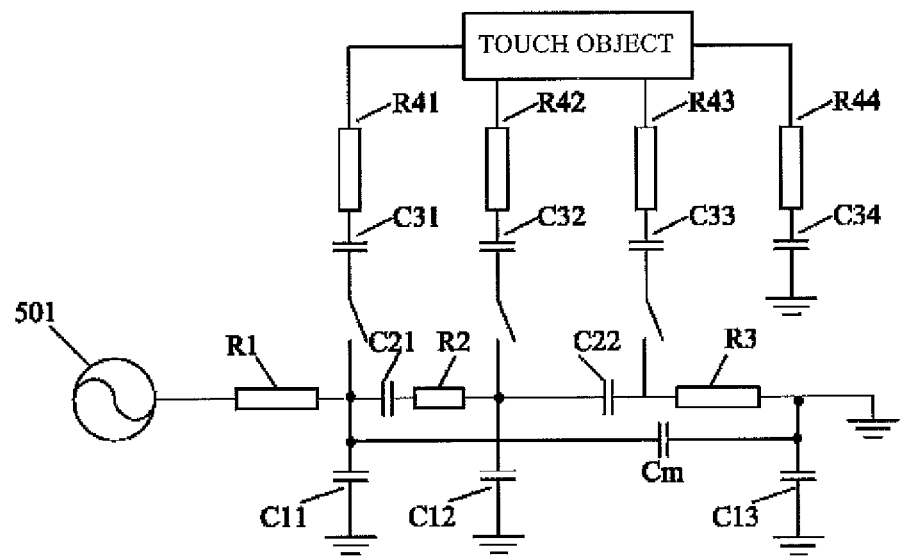
FIG. 5 is a schematic diagram of an equivalent circuit of the touch display device in one embodiment of the present disclosure.

For example, FIG. 5 shows a touch equivalent circuit model of a touch display device with added suspension electrodes 6 according to one embodiment of the present disclosure. The model may specifically include a signal source 501, a resistor R1 of the detection electrode 5, a parasitic capacitance C11 between the detection electrode 5 and the common electrode 3, a mutual capacitance C21 between the detection electrode 5 and the suspension electrode 6, touch object resistors R41, R42, R43, R44, a capacitance C31 between the detection electrode 5 and the touch object, a resistor R2 of the suspension electrode 6, a mutual capacitance C12 between the suspension electrode 6 and the common electrode 3, a mutual capacitance C22 between the suspension electrode 6 and the driving electrode 4, a capacitance C32 between the suspension electrode 6 and the touch object, a resistor R3 of the driving electrode 4, a parasitic capacitance C13 between the driving electrode 4 and the common electrode 3, a capacitance C33 between the driving electrode 4 and the touch object, a capacitance C34 between the touch object and the ground, and a mutual capacitance Cm between the detection electrode 5 and the driving electrode.

It can be seen from the model that, when a touch operation occurs, the capacitance between the suspension electrode 6 and the touch object is C32, the capacitance between the detection electrode 5 and the touch object is C31, the mutual capacitance between the driving electrode 4 and the suspension electrode 6 is C22, the parasitic capacitance between the detection electrode 5 and the common electrode 3 is C11, the mutual capacitance between the detection electrode 5 and the driving electrode 4 is Cm; comparing with the solution without suspension electrode in the related art, the technical solution of the present disclosure adds the capacitance C32 between the suspension electrode 6 and the touch object, and thus touch sensing change rate may be increased. Further, since an area of the detection electrode is smaller than that of the solution in the related art, thus, the mutual capacitance Cm between the detection electrode and the driving electrode is reduced, and the parasitic capacitance C11 between the detection electrode and the common electrode is also reduced. From the theoretical analysis and simulation results, as shown in Table 1, the structure of the touch display device in one embodiment of the present disclosure reduces the mutual capacitance value, but increase touch sensing change rate, and thus this can prove that the technical solution in one embodiment of the present disclosure may be applied to a model itself having a large projective mutual capacitance.

TABLE 1

| Pattern | Not touching (pf) | Touching (pf) | Difference value (pf) | Change rate (%) |
|---|---|---|---|---|
| no suspension electrode 6 added | 1.1247 | 0.9796 | 0.1451 | 12.9% |
| suspension electrode 6 added | 0.2593 | 0.12746 | 0.12847 | 50% |

It can be seen from the above simulation results that, comparing two most important parameters (difference values of mutual capacitances and change rates when touching and not touching) in touch pattern performance, the difference value is not greatly reduced when adding the suspension electrode 6, but the change rate of touch sensing rises from 12.9% to 50%; this can sufficiently explain advantages of the technical solution of one embodiment of the present disclosure.

The suspension electrode 6 in one embodiment of the present disclosure may not be electrically connected to the detection electrode 5 and the like arranged on the second substrate, and then may be in a high impedance state.

In one embodiment of the present disclosure, the coverage area of the detection electrode 5 may be adjusted by adjusting ratios of lengths and widths of the detection electrode 5 and the common electrode 3.

Figure 6:
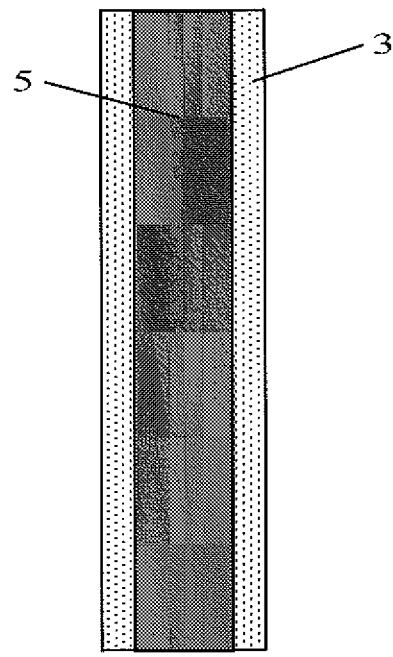
FIG. 6 is a first schematic diagram showing comparison between a coverage area of a detection electrode and a coverage area of a common electrode in the touch display device in one embodiment of the present disclosure.

In one specific embodiment, a width of the detection electrode 5 may be smaller than that of the common electrode 3, and a length of the detection electrode 5 may be equal to that of the common electrode 3, an example is shown in FIG. 6.

Figure 7:
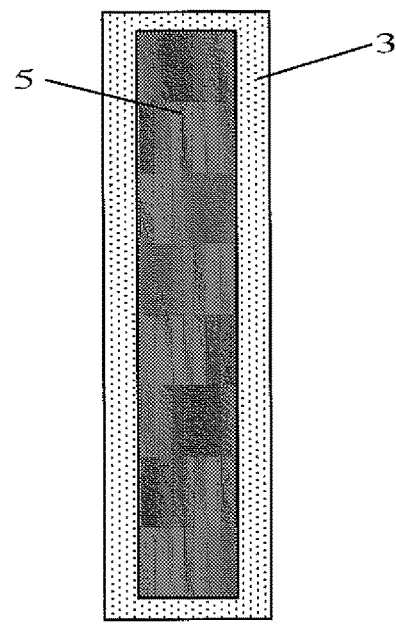
FIG. 7 is a second schematic diagram showing comparison between a coverage area of a detection electrode and a coverage area of a common electrode in the touch display device in one embodiment of the present disclosure.

In another specific embodiment, a width of the detection electrode 5 may be smaller than that of the common electrode 3, and a length of the detection electrode 5 may also be smaller than that of the common electrode 3, an example is shown in FIG. 7.

Figure 8:
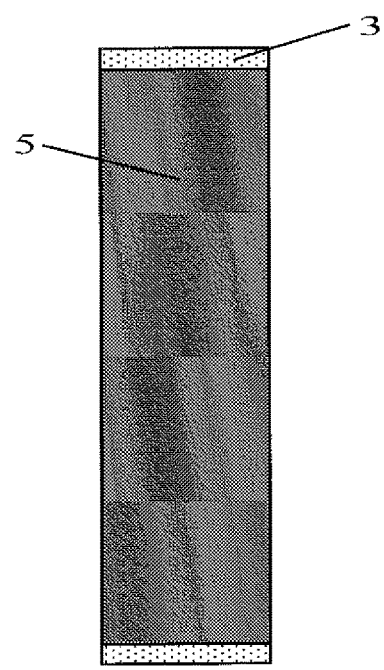
FIG. 8 is a third schematic diagram showing comparison between a coverage area of a detection electrode and a coverage area of a common electrode in the touch display device in one embodiment of the present disclosure.

In another specific embodiment, a width of the detection electrode 5 may be equal to that of the common electrode 3, but a length of the detection electrode 5 may be smaller than that of the common electrode 3, an example is shown in FIG. 8.

In sum, in one embodiment of the present disclosure, the coverage area of the detection electrode 5 may be reduced by adjusting the length and/or the width of the detection electrode 5.

Figure 13:
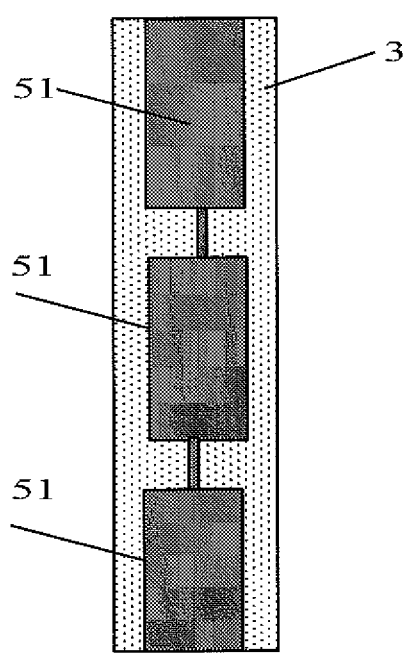
FIG. 13 is a fourth schematic diagram showing comparison between a coverage area of a detection electrode and a coverage area of a common electrode in the touch display device in one embodiment of the present disclosure.

In another specific embodiment, as shown in FIG. 13, the detection electrode 5 in one embodiment of the present disclosure may also be formed by at least two segments of metal wires 51, and electric connection between different segments of metal wires 51 may be realized by a jumper wire or a metal wire in other layers. Since there are gaps among the segments of metal wires 51, thus the coverage area of the detection electrode 5 is necessarily reduced, thereby causing the coverage area of the detection electrode 5 to be smaller than the coverage area of the common electrode 3.

Corresponding to the difference between the length, width parameters of the detection electrode 5 and the length, width parameters of the common electrode 3, the suspension electrode 6 in one embodiment of the present disclosure may be arranged on at least one side of the detection electrode 5.

Figure 9:
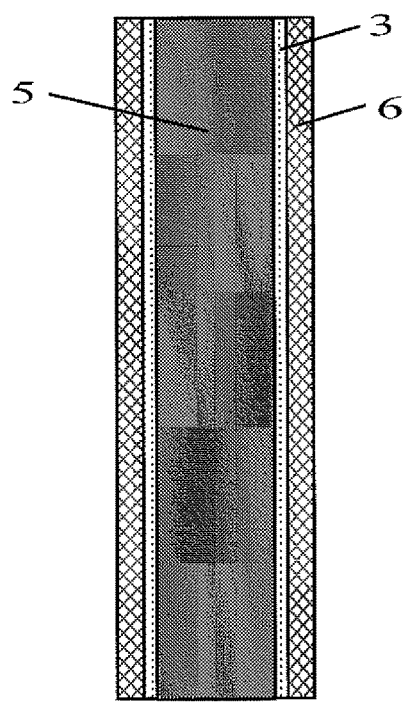
FIG. 9 is a first schematic diagram showing a position of a suspension electrode in the touch display device in one embodiment of the present disclosure.

For example, when the length, width parameters of the detection electrode 5 and the length, width parameters of the common electrode 3 are as shown in FIG. 6, the suspension electrodes 6 may be arranged on two sides of the detection electrode along the horizontal direction, as shown in FIG. 9.

Figure 10:
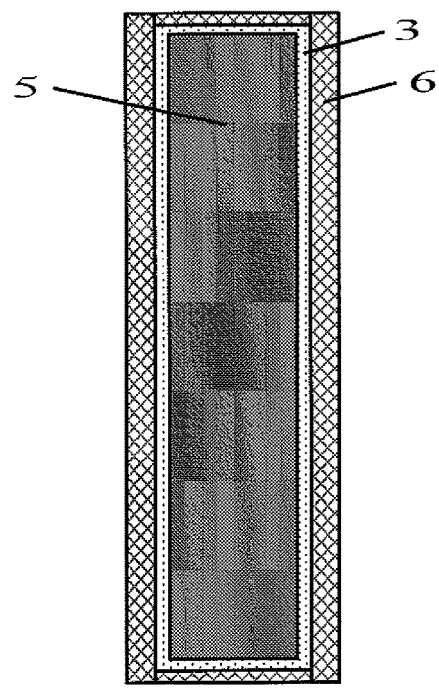
FIG. 10 is a second schematic diagram showing a position of a suspension electrode in the touch display device in one embodiment of the present disclosure.

When the length, width parameters of the detection electrode 5 and the length, width parameters of the common electrode 3 are as shown in FIG. 7, the suspension electrodes 6 may be arranged on at least one of four sides of the detection electrode along the horizontal direction and vertical direction; as an instance, the suspension electrodes 6 are arranged on the four sides as shown in FIG. 10.

Figure 11:
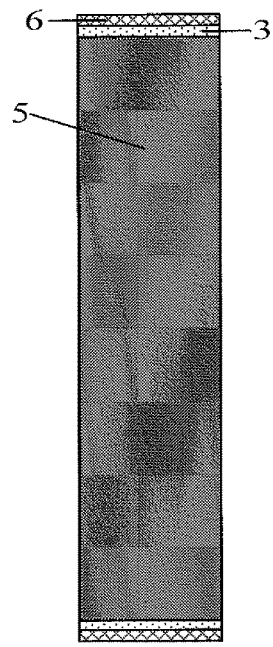
FIG. 11 is a third schematic diagram showing a position of a suspension electrode in the touch display device in one embodiment of the present disclosure.

When the length, width parameters of the detection electrode 5 and the length, width parameters of the common electrode 3 are as shown in FIG. 8, the suspension electrodes 6 may be arranged on two sides of the detection electrode 5 along the vertical direction, as shown in FIG. 11.

Figure 14:
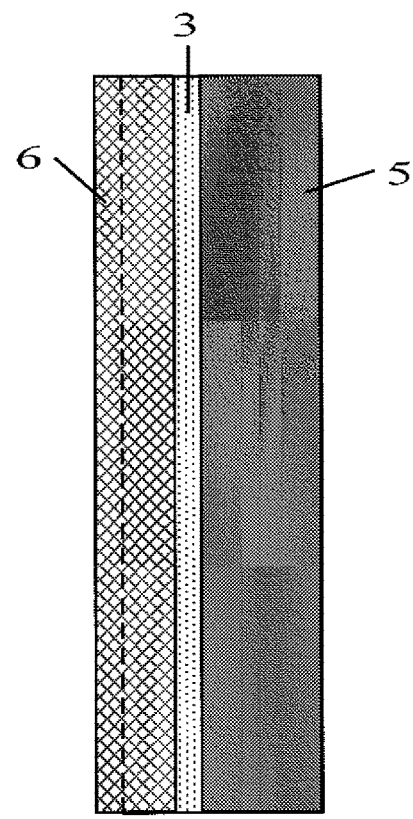
FIG. 14 is a schematic diagram showing a position of a suspension electrode in the touch display device in one embodiment of the present disclosure.

In one embodiment of the present disclosure, when the width of the detection electrode 5 is smaller than that of the common electrode 3, a sum of the width of the detection electrode 5 and a width of the suspension electrode 6 arranged on at least one side of the detection electrode 5 along the horizontal direction, may be equal to or greater than the width of the common electrode 3 corresponding to the detection electrode 5. For example, as shown in FIG. 9, the sum of the width of the detection electrode 5 and the widths of the suspension electrodes 6 arranged on two sides of the detection electrode 5 along the horizontal direction and the widths of the gaps between the detection electrode 5 and the suspension electrodes 6, is equal to the width of the common electrode 3. For example, as shown in FIG. 14, the sum of the width of the detection electrode 5 and the width of the suspension electrode 6 arranged on the left side of the detection electrode 5 along the horizontal direction and the width of the gap between the detection electrode 5 and the suspension electrode 6, is greater than the width of the common electrode 3.

When the length of the detection electrode 5 is smaller than that of the common electrode 3, a sum of the length of the detection electrode 5 and a length of the suspension electrode 6 arranged on at least one side of the detection electrode 5 along the vertical direction and the length of the gap between the detection electrode 5 and the suspension electrode 6 arranged on at least one side of the detection electrode 5, may be equal to the length of the common electrode 3 corresponding to the detection electrode 5. For example, as shown in FIG. 11, the sum of the length of the detection electrode 5 and the lengths of the suspension electrodes 6 arranged on two sides of the detection electrode 5 along the vertical direction and the lengths of the gaps between the detection electrode 5 and the suspension electrodes 6, is equal to the length of the common electrode 3 corresponding to the detection electrode 5.

The suspension electrode 6 in one embodiment of the present disclosure may be specifically arranged in a same layer as the detection electrode 5, as shown in FIG. 2, and a pattern of the layer where the suspension electrode 6 and the detection electrode 5 are may be simultaneously formed through a one-time patterning process. Of course, the suspension electrode 6 and the detection electrode 5 may be manufactured by adopting other mature ways in one embodiment of the present disclosure.

Figure 15:
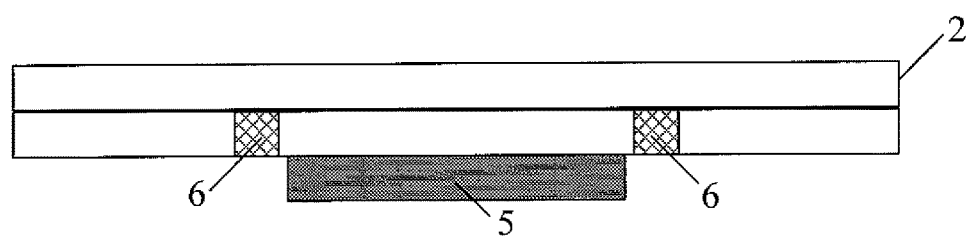
FIG. 15 is a schematic diagram showing relative position relationship between a detection electrode and suspension electrodes in the touch display device in one embodiment of the present disclosure.
Figure 16:
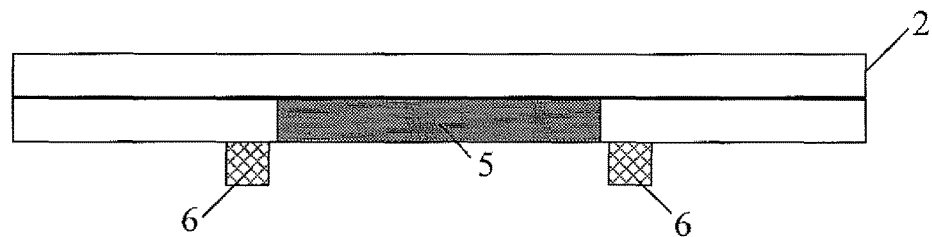
FIG. 16 is a schematic diagram showing relative position relationship between a detection electrode and suspension electrodes in the touch display device in one embodiment of the present disclosure.
Figure 17:
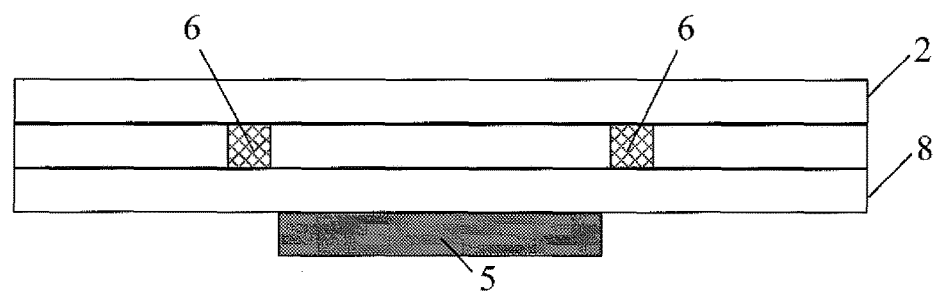
FIG. 17 is a schematic diagram showing a flat layer between a detection electrode and suspension electrodes in the touch display device in one embodiment of the present disclosure.
Figure 18:
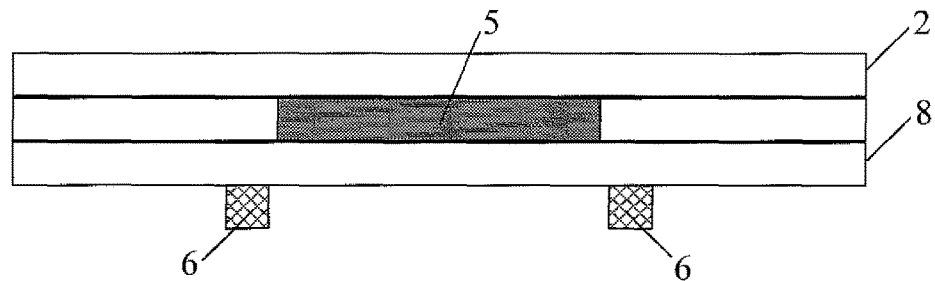
FIG. 18 is a schematic diagram showing a flat layer between a detection electrode and suspension electrodes in the touch display device in one embodiment of the present disclosure.

The suspension electrode 6 and the detection electrode 5 may also be arranged in different layers, i.e., the layer where the suspension electrode 6 is arranged is above or below the layer where the detection electrode 5 is arranged, and a flat layer or other layer is arranged between the suspension electrode 6 and the detection electrode 5. The flat layer may also play the role of insulation. In the manufacture process, the suspension electrode 6 and the detection electrode 5 in different layers as well as the layer between the suspension electrode 6 and the detection electrode 5, may be manufactured through a one-time patterning process or a multi-time patterning process. As shown in FIG. 15, the layer where the suspension electrode 6 is arranged is below the layer where the detection electrode 5 is arranged. As shown in FIG. 16, the layer where the suspension electrode 6 is arranged is above the layer where the detection electrode 5 is arranged. As shown in FIG. 17, a flat layer 8 is arranged between the suspension electrodes 6 and the detection electrode 5, and the layer where the suspension electrode 6 is arranged is below the layer where the detection electrode 5 is arranged. As shown in FIG. 18, a flat layer 8 is arranged between the suspension electrodes 6 and the detection electrode 5, the layer where the suspension electrode 6 is arranged is above the layer where the detection electrode 5 is arranged.

Figure 12:
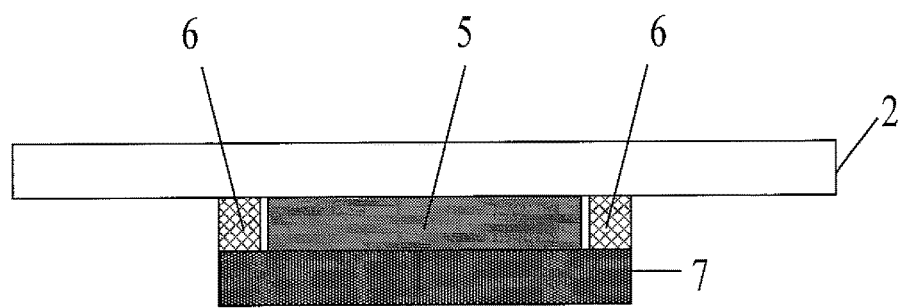
FIG. 12 is a second schematic diagram showing a structure of a second substrate in one embodiment of the present disclosure.

The second substrate 2 in one embodiment of the present disclosure may specifically be provided with a black matrix 7 for covering the detection electrode 5 and the suspension electrode 6, as shown in FIG. 12, the black matrix 7 is specifically arranged on the detection electrode 5 and the suspension electrode 6.

The first substrate in the above embodiment of the present disclosure specifically may be an array substrate, while the second substrate in the above embodiment of the present disclosure specifically may be a color filter substrate.

The touch display device in one embodiment of the present disclosure specifically may be a liquid crystal panel, a liquid crystal television, a liquid crystal monitor, an organic light-emitting diode (OLED) panel, an OLED monitor, a plasma monitor, or an electronic paper, etc.

One embodiment of the present disclosure further provides a method for manufacturing the touch display device 100 in the above embodiment of the present disclosure, and the method may include:

providing a first substrate 1 and a second substrate 2;

forming a common electrode layer on the first substrate 1, the common electrode layer including a pattern of a common electrode 3 and a driving electrode 4 which are alternately arranged.

The method may specifically include:

forming patterns of a detection electrode 5 and a suspension electrode 6 on the second substrate 2 in such a manner that the detection electrode 5 is arranged opposite to the common electrode 3, a coverage area of the detection electrode 5 is smaller than a coverage area of the common electrode 3, the coverage area of the detection electrode 5 on the second substrate 2 does not overlap with a coverage area of the driving electrode 4 on the first substrate 1 when the first substrate 1 and the second substrate 2 are assembled to form a cell;

the suspension electrode 6 being arranged on at least one side of the detection electrode 5 and insulated from the detection electrode 5.

Optionally, the process of forming a pattern of a detection electrode 5 on the second substrate 2 includes:

forming at least two segments of metal wires at preset positions in a preset layer of the second substrate 2;

electrically connecting the at least two segments of metal wires so that the at least two segments of metal wires being electrically connected form the pattern of the detection electrode 5.

Optionally, the patterns of the detection electrode 5 and the suspension electrode 6 are formed in the same layer through a one-time patterning process.

Optionally, the process of forming patterns of a detection electrode 5 and a suspension electrode 6 on the second substrate 2 may specifically include:

forming a pattern of the detection electrode 5 on the second substrate 2;

forming a pattern of a flat layer on the detection electrode 5;

forming a pattern of the suspension electrode 6 on the flat layer;

Or, the process of forming patterns of a detection electrode 5 and a suspension electrode 6 on the second substrate 2 may specifically include:

forming a pattern of the suspension electrode 6 on the second substrate 2;

forming a pattern of a flat layer on the suspension electrode 6;

forming a pattern of the detection electrode 5 on the flat layer.

Optionally, the above method in one embodiment of the present disclosure may further include:

forming a pattern of a black matrix 7 for covering the detection electrode 5 and the suspension electrode 6 on the detection electrode 5 and the suspension electrode 6 of the second substrate 2.

It can be seen from the above description that, in the touch display device and the method for manufacturing the same in the present disclosure, the touch display device includes the first substrate and the second substrate, the first substrate is provided with the common electrode and the driving electrode, the second substrate is provided with the detection electrode and the suspension electrode, the detection electrode is opposite to the common electrode, a coverage area of the detection electrode is smaller than a coverage area of the common electrode, the coverage area of the detection electrode on the second substrate does not overlap with a coverage area of the driving electrode on the first substrate when the first substrate and the second substrate are assembled to form a cell; the suspension electrode is arranged on at least one side of the detection electrode and insulated from the detection electrode. Thus, the parasitic capacitance between the detection electrode and the common electrode may be reduced, thereby ensuring quality of touch sensing signal acquired by the chip and improving touch induction capacitance change rate.

In the present disclosure, the patterning process may only include the lithography process, or may include the lithography process and etching process, as well as other process for forming preset patterns such as printing, ink-jet, etc. The lithography process refers to a technology which includes film-forming, exposing, developing and other process that uses photoresist, a mask, an exposure machine, etc. to form patterns. A corresponding patterning process may be selected according to the structure formed in the present disclosure.

Those described above are embodiments of the present disclosure. It should be noted that, for those skilled in the art, improvements and substitutions may also be made without departing from the principle of the present disclosure. Those improvements and substitutions should also be considered as the scope of the present disclosure.

What is claimed is:

1. A touch display device comprising:
a first substrate;
a second substrate;
a common electrode layer on the first substrate that is provided with a common electrode and a driving electrode which are alternately arranged;
a detection electrode on the second substrate that is arranged opposite to the common electrode, wherein a coverage area of the detection electrode on the second substrate is smaller than a coverage area of the common electrode on the first substrate, and the coverage area of the detection electrode on the second substrate does not overlap with a coverage area of the driving electrode on the first substrate when the first substrate and the second substrate are assembled to form a cell;
a suspension electrode on the second substrate to increase a touch induction capacitance change rate of the touch display device, wherein the suspension electrode is arranged on at least one side of the detection electrode and insulated from the detection electrode; and
wherein a projection of the suspension electrode on the first substrate does not overlap with the driving electrode on the first substrate.

2. The touch display device according to claim 1, wherein a width of the detection electrode is smaller than that of the common electrode, and a length of the detection electrode is equal to that of the common electrode.

3. The touch display device according to claim 2, wherein a sum of the width of the detection electrode and a width of the suspension electrode arranged on at least one side of the detection electrode along the horizontal direction and a width of a gap between the detection electrode and the suspension electrode arranged on at least one side of the detection electrode along the horizontal direction is equal to or greater than the width of the common electrode corresponding to the detection electrode.

4. The touch display device according to claim 1, wherein a width of the detection electrode is smaller than that of the common electrode, and a length of the detection electrode is smaller than that of the common electrode.

5. The touch display device according to claim 4, wherein a sum of the length of the detection electrode and a length of the suspension electrode arranged on at least one side of the detection electrode along the vertical direction and a width of a gap between the detection electrode and the suspension electrode arranged on at least one side of the detection electrode along the vertical direction is equal to the length of the common electrode corresponding to the detection electrode.

6. The touch display device according to claim 4, wherein a sum of the width of the detection electrode and a width of the suspension electrode arranged on at least one side of the detection electrode along the horizontal direction is equal to or greater than the width of the common electrode corresponding to the detection electrode.

7. The touch display device according to claim 1, wherein a width of the detection electrode is equal to that of the common electrode, and a length of the detection electrode is smaller than that of the common electrode.

8. The touch display device according to claim 1, wherein the detection electrode is formed by at least two segments of metal wires; and different segments of metal wires are electrically connected.

9. The touch display device according to claim 1, wherein the suspension electrode and the detection electrode are arranged in a same layer.

10. The touch display device according to claim 1, wherein a layer where the suspension electrode is arranged is below or above a layer where the detection electrode is arranged.

11. The touch display device according to claim 10, wherein a flat layer is arranged between the suspension electrode and the detection electrode.

12. The touch display device according to claim 1, wherein the second substrate is further provided with a black matrix for covering the detection electrode and the suspension electrode, and the black matrix is arranged on the detection electrode and the suspension electrode.

13. The touch display device according to claim 1, wherein the first substrate is an array substrate, and the second substrate is a color filter substrate.

14. The touch display device according to claim 1, wherein different common electrodes separated by driving electrodes are transversely connected by metal wires of a gate electrode layer.

15. The touch display device according to claim 1, wherein different driving electrodes separated by common electrodes are transversely connected by metal wires of a gate electrode layer.

16. A method for manufacturing a touch display device comprising steps of:
providing a first substrate and a second substrate;
forming a common electrode layer on the first substrate, the common electrode layer comprising a pattern of a common electrode and a driving electrode which are alternately arranged; and
forming patterns of a detection electrode and a suspension electrode on the second substrate in such a manner that the detection electrode is arranged opposite to the common electrode, a coverage area of the detection electrode on the second substrate is smaller than a coverage area of the common electrode on the first substrate, the coverage area of the detection electrode on the second substrate does not overlap with a coverage area of the driving electrode on the first substrate when the first substrate and the second substrate are assembled to form a cell;
wherein the suspension electrode is arranged on at least one side of the detection electrode and insulated from the detection electrode, and the suspension electrode is arranged to increase a touch induction capacitance change rate of the touch display device; and wherein a projection of the suspension electrode on the first substrate does not overlap with the driving electrode on the first substrate.

17. The method according to claim 16, wherein the step of forming a pattern of the detection electrode on the second substrate comprises:

forming at least two segments of metal wires at preset positions in a preset layer of the second substrate; and electrically connecting the at least two segments of metal wires so that the at least two segments of metal wires being electrically connected form the pattern of the detection electrode.

18. The method according to claim 16, wherein the patterns of the detection electrode and the suspension electrode are formed in the same layer through a one-time patterning process.

19. The method according to claim 16, wherein the step of forming the patterns of the detection electrode and the suspension electrode on the second substrate comprises:

forming a pattern of the detection electrode on the second substrate;

forming a pattern of a flat layer on the detection electrode; and forming a pattern of the suspension electrode on the flat layer; or, the step of forming the patterns of the detection electrode and the suspension electrode on the second substrate comprises:

forming a pattern of the suspension electrode on the second substrate;

forming a pattern of a flat layer on the suspension electrode; and forming a pattern of the detection electrode on the flat layer.

20. The method according to claim 17, further comprising:

forming a pattern of a black matrix on the detection electrode and the suspension electrode of the second substrate so as to cover the detection electrode and the suspension electrode.

* * * * *